United States Patent
Kuroki et al.

(10) Patent No.: US 10,030,966 B2
(45) Date of Patent: Jul. 24, 2018

(54) LENGTH MEASURING APPARATUS, AND METHOD OF MANUFACTURING ARTICLE

(71) Applicant: CANON KABUSHIKI KAISHA, Tokyo (JP)

(72) Inventors: Yukie Kuroki, Utsunomiya (JP); Takayuki Uozumi, Utsunomiya (JP); Hiroshi Koike, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 14 days.

(21) Appl. No.: 15/196,731

(22) Filed: Jun. 29, 2016

(65) Prior Publication Data
US 2017/0003115 A1    Jan. 5, 2017

(30) Foreign Application Priority Data

Jun. 30, 2015 (JP) ................... 2015-132152

(51) Int. Cl.
| | |
|---|---|
| *G01B 11/06* | (2006.01) |
| *G01B 11/04* | (2006.01) |
| *G01B 9/02* | (2006.01) |
| *G01S 17/58* | (2006.01) |
| *G01P 3/68* | (2006.01) |
| *G01R 23/10* | (2006.01) |
| *G01D 5/26* | (2006.01) |

(52) U.S. Cl.
CPC ........ *G01B 11/043* (2013.01); *G01B 9/02045* (2013.01); *G01P 3/68* (2013.01); *G01S 17/58* (2013.01); *G01D 5/26* (2013.01); *G01R 23/10* (2013.01)

(58) Field of Classification Search
CPC .... G01B 9/02045; G01B 11/04; G01B 11/043
See application file for complete search history.

(56) References Cited

U.S. PATENT DOCUMENTS

| | | | | |
|---|---|---|---|---|
| 4,334,779 A | * | 6/1982 | Domey ................ | G01B 11/043 356/28.5 |
| 4,696,568 A | * | 9/1987 | Weistra .................. | G01S 17/58 342/104 |

(Continued)

FOREIGN PATENT DOCUMENTS

| | | |
|---|---|---|
| DE | 3322279 A1 | 12/1984 |
| JP | H06-011311 A | 1/1994 |

(Continued)

*Primary Examiner* — Michael A Lyons
(74) *Attorney, Agent, or Firm* — Canon U.S.A., Inc. IP Division

(57) ABSTRACT

A length measuring apparatus configured to perform length measurement for an object moving in a measurement region includes a detector configured to detect light modulated by the object with a Doppler effect, and a processor configured to obtain a measurement value of a velocity of the object based on a signal from the detector, and obtain a length for the object based on the measurement value. The processor is configured to specify a point in time corresponding to the object based on an amplitude of the signal, obtain the measurement value based on the signal with respect to a time duration defined by the point in time, and obtain the length based on the measurement value obtained with respect to the time duration.

11 Claims, 16 Drawing Sheets

(56) References Cited

U.S. PATENT DOCUMENTS

| | | | | | |
|---|---|---|---|---|---|
| 4,948,257 | A | * | 8/1990 | Kaufman | G01P 5/26 356/28.5 |
| 5,047,653 | A | * | 9/1991 | Garcia | G01P 5/26 250/235 |
| 5,325,178 | A | * | 6/1994 | Louis | G01B 11/04 250/559.21 |
| 9,255,788 | B1 | * | 2/2016 | Tsai | G01B 11/002 |
| 2006/0225292 | A1 | * | 10/2006 | Taylor | G01B 11/043 33/227 |

FOREIGN PATENT DOCUMENTS

| | | |
|---|---|---|
| JP | H07-198849 A | 8/1995 |
| JP | H07-332938 A | 12/1995 |
| JP | 2011-174884 A | 9/2011 |
| JP | 2014-006161 A | 1/2014 |
| WO | 2012/087220 A1 | 6/2012 |

* cited by examiner

TIME DURATION D

FIG. 12A
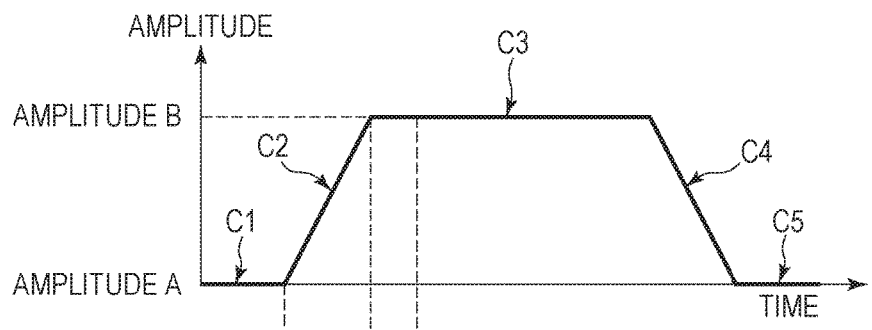
FIG. 12B
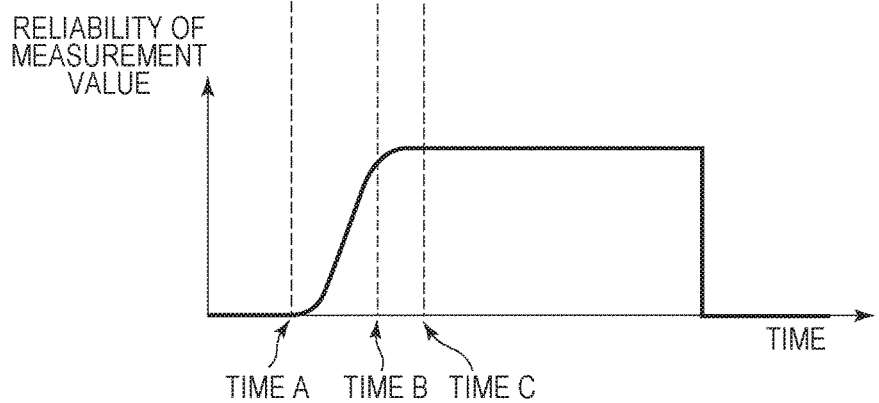
FIG. 12C1
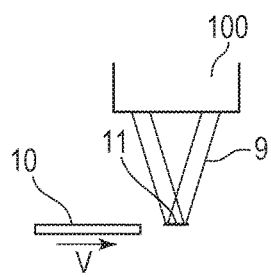
FIG. 12C2
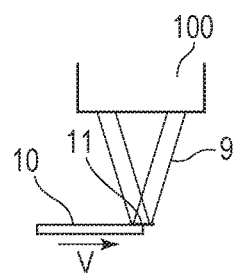
FIG. 12C3
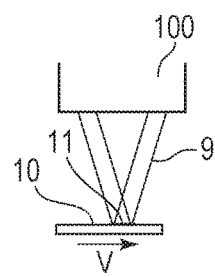
FIG. 12C4
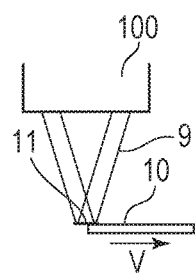
FIG. 12C5
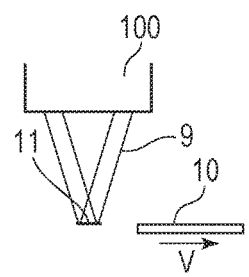

LENGTH MEASURING APPARATUS, AND METHOD OF MANUFACTURING ARTICLE

BACKGROUND OF THE INVENTION

Field of the Invention

The present invention relates to a length measuring apparatus that performs length measurement for a moving object, and to a method of manufacturing an article.

Description of the Related Art

There has been used a Doppler velocimeter (hereinafter, also merely referred to as "velocimeter") as an apparatus that measures the velocity of a moving object. A laser Doppler velocimeter (LDV) irradiates an object with laser light, and measures the velocity of the object by using the Doppler effect. The Doppler effect is an effect that the frequency (wavelength) of scattered light from an object shifts in proportion to the moving velocity of the object.

A laser Doppler velocimeter disclosed in Japanese Patent Laid-Open No. 7-198849 uses a dedicated sensor that detects whether an object is deviated from laser light or not, and, in a state in which a laser Doppler signal is stopped, performs interpolation of the signal and recovery to a normal measurement state.

Also, in a method of measuring a rail length disclosed in Japanese Patent Laid-Open No. 7-332938, a play identifying sensor for identifying a play of a rail is included in addition to a laser Doppler sensor. Both the play and rail length are obtained on the basis of the outputs of both the sensors.

Velocity measurement or length measurement according to related art has required a second sensor in addition to a sensor for velocity measurement to prevent a phenomenon, in which measurement light from an object is no longer detected and measurement is no longer continued, from occurring.

If the length measurement is performed for a moving object on the basis of the velocity of the moving object obtained by Doppler velocity measurement, it is required to detect a point in time at which the moving object enters measurement light for the velocity measurement and a point in time at which the moving object escapes from the measurement light. However, providing an additional sensor for the detection like related art may be disadvantageous in view of a space or a part which are added for the additional sensor.

SUMMARY OF THE INVENTION

The present invention provides a length measuring apparatus advantageous in performing of length measurement for a moving object.

The present invention provides a length measuring apparatus configured to perform length measurement for an object moving in a measurement region. The apparatus includes a detector configured to detect light modulated by the object with a Doppler effect; and a processor configured to obtain a measurement value of a velocity of the object based on a signal from the detector and obtains a length for the object based on the measurement value. The processor is configured to specify a point in time corresponding to the object based on an amplitude of the signal, obtain the measurement value based on the signal with respect to a time duration defined by the point in time, and obtain the length based on the measurement value obtained with respect to the time duration.

Further features of the present invention will become apparent from the following description of exemplary embodiments with reference to the attached drawings.

BRIEF DESCRIPTION OF THE DRAWINGS

FIGS. 12A, 12B, and 12C1 to 12C5 exemplarily illustrate the amplitude of a signal from a detector and the reliability of a measurement value.

DESCRIPTION OF THE EMBODIMENTS

Embodiments of the present invention are described below with reference to the attached drawings. The same reference sign is applied to the same member and so force throughout all the drawings for describing the embodiments and the repetitive description is omitted as a general rule (unless otherwise noted).

First Embodiment

Figure 1:
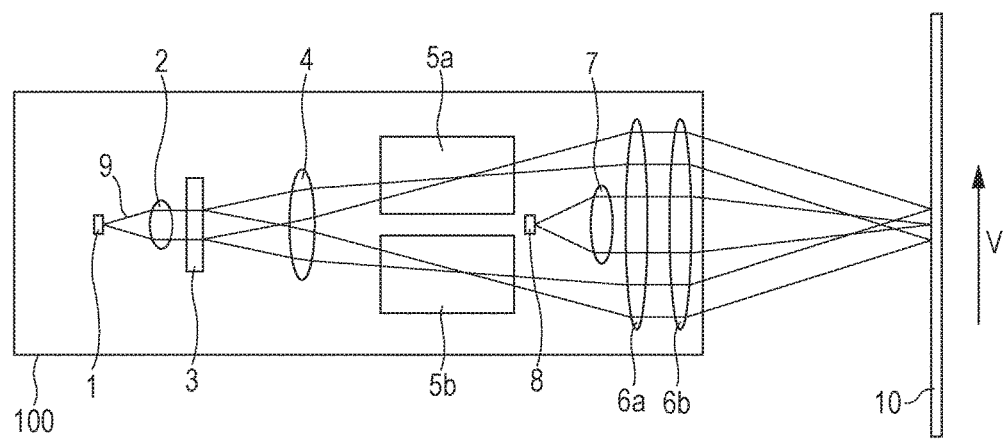
FIG. 1 illustrates a configuration example of a head unit of a velocimeter.

FIG. 1 illustrates a configuration example of a head unit of a velocimeter. A head unit 100 serving as a detector includes an optical system configured to irradiate an object (a measurement object) 10 with light and receive the light from the object 10, and configures a head unit of a laser Doppler velocimeter. Light rays 9 emitted from a light source 1, which may include a laser diode, are collimated by a collimator lens 2, and are incident on a diffraction grating (a diffractive element) 3. The light rays 9 incident on the diffraction grating 3 are split into ±1st order diffracted light rays (the diffraction angle being θ). The ±1st order diffracted light rays respectively become condensed light rays by a lens 4. The condensed light rays are respectively transmitted through EO elements 5a and 5b. The two transmitted light rays are collimated by lenses 6a and 6b, and irradiate the object 10 from mutually different irradiation directions at an angle substantially equivalent to the diffraction angle θ. The irradiating light rays are diffused and reflected by a surface (typically, a rough surface) of the object 10. The diffused and reflected light rays are condensed through the lenses 6a and 6b and a condenser lens 7, and incident on a light receiving element 8, which may include a photodiode. A signal obtained by photoelectric conversion at the light receiving element 8 is input to a processor (described later), as an analog signal having a frequency F corresponding to a velocity V of the object 10 and having a modulated intensity. The frequency F is called a Doppler frequency and expressed by Expression (1) as follows:

$$F=2V/P+F\_EO \qquad (1).$$

Figure 2A:
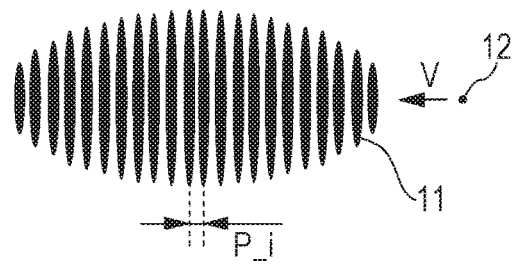
FIGS. 2A to 2C are schematic illustrations for describing a fringe model.
Figure 2B:
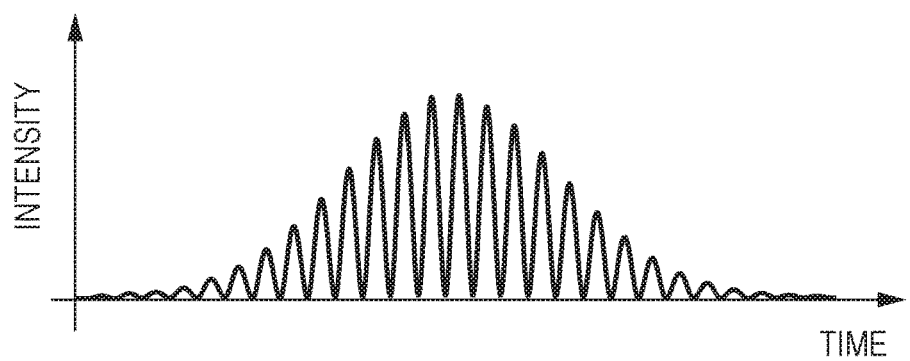
Figure 2C:
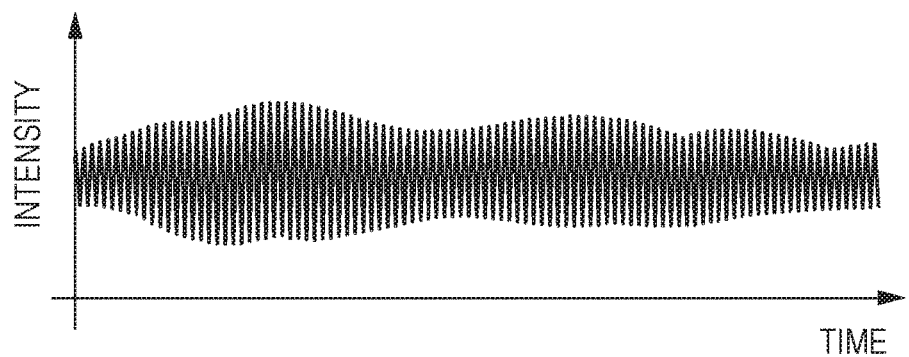

In the expression, P represents a grating pitch of the diffraction grating 3, and F_EO represents a drive frequency of the EO elements 5a and 5b. There is known a fringe (an interference fringe) model as a model for describing the operating principle of the laser Doppler velocimeter using the Doppler effect. FIGS. 2A to 2C are schematic illustrations for describing the fringe model. The two light rays irradiating the object 10 intersect with each other on the surface of the object 10, and hence a fringe 11 as shown in FIG. 2A is formed in the intersection region (measurement region). A particle 12 with a size equal to or smaller than the fringe pitch of this fringe 11 passes through (bright and dark portions of) the fringe 11 at a velocity V, and hence diffused light having a frequency F and having a modulated intensity as shown in FIG. 2B is generated. The frequency F in this case is expressed by Expression (2) as follows:

$$F=V/P\_i \qquad (2).$$

Figure 6A:
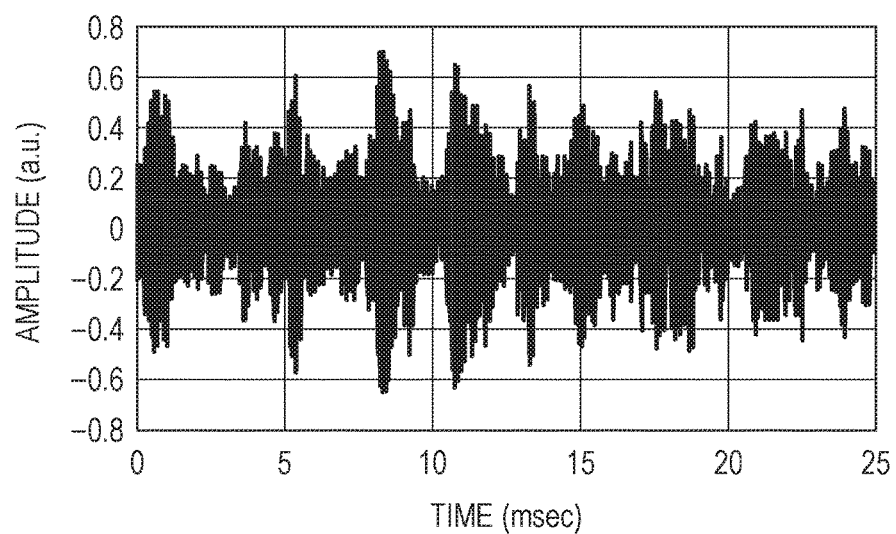
FIGS. 6A and 6B exemplarily illustrate an analog signal to be input to a processor.
Figure 6B:
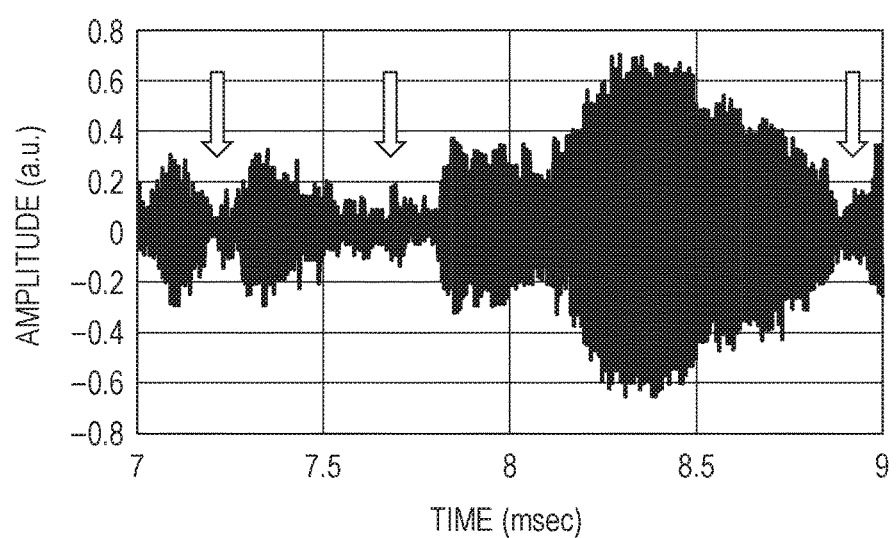

In the expression, P_i represents a fringe pitch. The diffraction angle θ is derived from a relational expression sin θ=λ/P, where λ is a wavelength of the light rays 9 emitted from the light source 1. Also, if a configuration is made so that the incident angle of the light rays on the object 10 is equivalent to the diffraction angle θ, the fringe pitch P_i can be expressed as P_i=λ/2 sin(θ)=P/2. By using this relational expression and Expression (2), the first term on the right side of Expression (1) is derived. Also, a low frequency component (an envelope component) in FIG. 2B reflects the intensity distribution of the light rays 9 emitted from the light source 1, and may typically reflect a Gaussian distribution. The surface of the object 10 has random surface roughness and may be considered as a set of particles 12 having a plurality of random characteristics. Hence, by obtaining the sum total of signals as shown in FIG. 2B having a plurality of random phases and amplitudes, a signal as shown in FIG. 2C is obtained. FIGS. 6A and 6B exemplarily illustrate an analog signal to be input to a processor 101 (described later). Since the signal in FIG. 2C obtained in accordance with the fringe model is similar to the actual signal in FIGS. 6A and 6B, it is found that the fringe model can describe the operating principle of the laser Doppler velocimeter.

Figure 3:
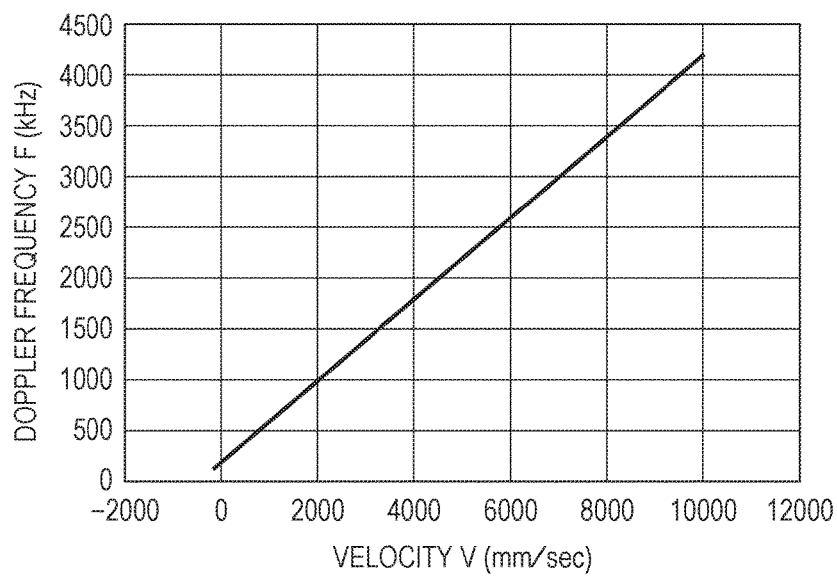
FIG. 3 exemplarily illustrates the relationship between the velocity of an object and the Doppler frequency.

The second term on the right side of Expression (1) is described next. The signal in FIG. 2C has a high frequency component reflecting the velocity of the object 10 and a low frequency component reflecting the surface characteristics of the object 10. Hence, as the velocity V approaches 0, it may be more difficult to obtain the velocity from the signal. Also, the direction of the velocity V cannot be detected. Owing to this, the EO elements are provided in FIG. 1. The EO elements 5a and 5b may include, for example, electrooptic crystal (for example, including $LiNbO_3$ crystal) and may each be an electrooptic phase modulation element. Since such an element is included, the velocity of the object is obtained even when the object is stopped and the direction of the velocity is obtained. The EO elements 5a and 5b can change the phases of light rays transmitted therethrough by an applied voltage. If the EO elements 5a and 5b modulate the two light rays, which are respectively transmitted therethrough, to change the phases to be in the mutually opposite directions with a constant frequency F_EO, the fringe 11 is moved with the frequency F_EO by one pitch each. For example, the applied voltage to the EO elements 5a and 5b is changed into a sawtooth shape, and accordingly, the apparent change in the phases may be constant. As described above, if a stationary particle 12 is placed while the fringe 11 moves with the frequency F_EO, diffused and reflected light having the intensity modulated with the frequency F_EO is generated. This is equivalent to a case in which the velocity is offset in a certain direction. Hence, by configuring the laser Doppler velocimeter including the EO elements 5a and 5b as described above, the stationary state (zero velocity) and the direction of the velocity can be detected. For example, the relationship between the velocity V and the Doppler frequency F in a case of a grating pitch P of the diffraction grating 3=5[μm] and F_EO=200 [kHz]. FIG. 3 exemplarily illustrates the relationship between the velocity of an object and the Doppler frequency. When the lower limit is 100 [kHz] and the upper limit is 4.2 [MHz] for the frequency of the signal that can be processed by the processor (described later), the measurable velocity range is a range from −250 [mm/s] to 10 [m/s]. The values of the grating pitch P and the phase modulation frequency F_EO can be properly selected in accordance with the specifications of the laser Doppler velocimeter. The example of performing the phase modulation with the EO elements has been described here; however, phase modulation may be performed with another element such as an acousto-optic element.

Figure 4:
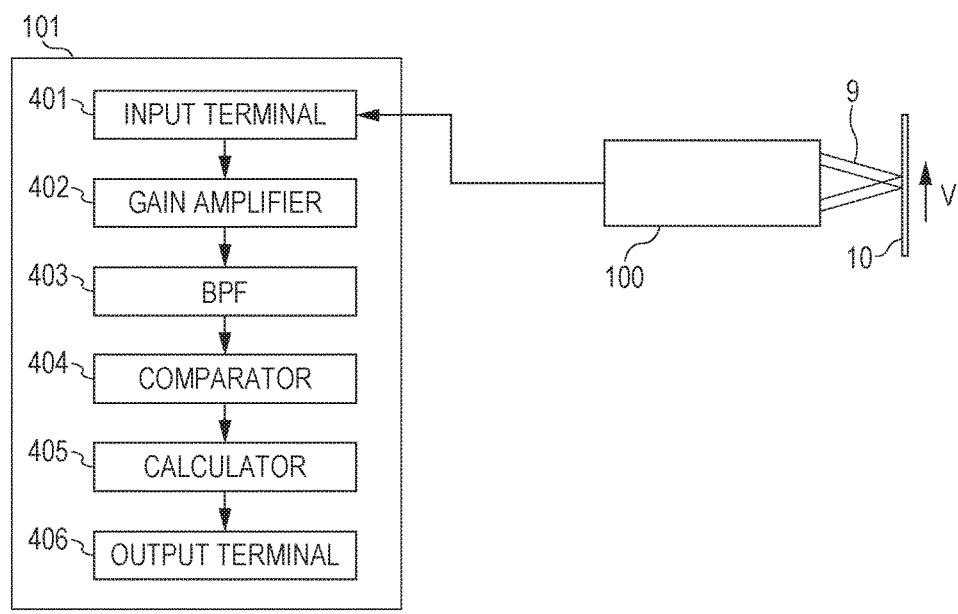
FIG. 4 illustrates a configuration example of the velocimeter.

FIG. 4 illustrates a configuration example of the velocimeter. The intensity modulation signal having the frequency F obtained by the head unit 100 is input to the processor 101 as described above. The analog signal input to the processor through an input terminal 401 is amplified by a gain amplifier 402, then filtered by a band pass filter (BPF) 403, and binarized by a comparator 404. Based on the signal obtained by the binarization, (information on) the velocity is obtained by a calculator 405 and (the information on) the obtained velocity is output from an output terminal 406.

Figure 5A:
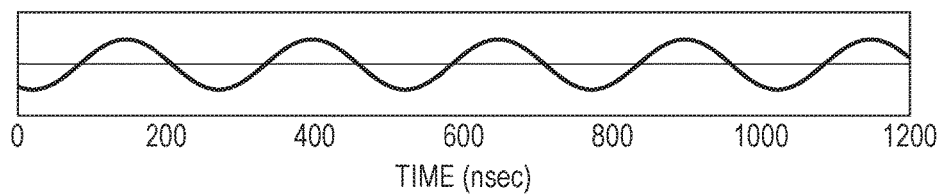
FIGS. 5A to 5C exemplarily illustrate signal processing contents.
Figure 5B:
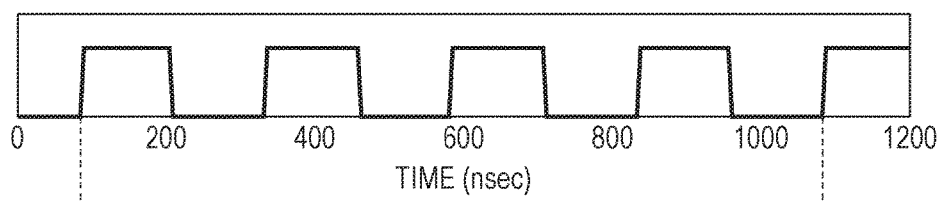
Figure 5C:
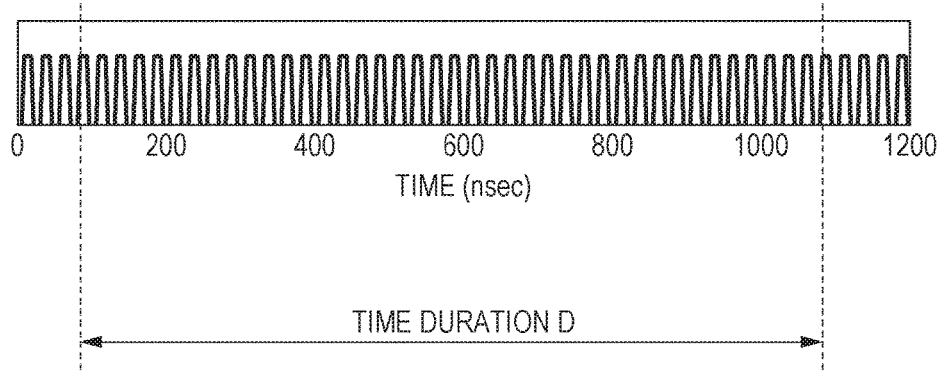

FIGS. 5A to 5C exemplarily illustrate signal processing contents. FIG. 5A shows an input signal and FIG. 5B shows a signal obtained by binarization by the comparator when the velocity V of the object 10=9500 [mm/s] and the Doppler frequency F=4 [MHz]. FIG. 5C shows a (reference) clock signal in the processor 101. A reference clock (not shown) that gives the clock signal may be located inside or outside the processor. In this case, the reference clock frequency is 40 [MHz]. In this embodiment, continuous N rising intervals in the signal obtained by the binarization are clocked (counted) with the reference clock. One rising interval is a time interval between two rising timings (a timing is also referred to as a time) at two adjacent pulses.

The Doppler frequency F is obtained on the basis of a time (a time duration D) obtained by the clocking, and (the information on) the velocity V of the object 10 is obtained on the basis of Expression (1). In this case, it is assumed that N=4. In the case of FIG. 5B and FIG. 5C, the count value of four rising intervals in the signal obtained by the binarization is 40 (counts). Since the frequency of the reference clock is known, the Doppler frequency F can be obtained from the count value (the clock value). The velocity V may be obtained by calculation based on Expression (1), or may be obtained with reference to a prepared table showing the relationship between the count value (the clock value) and the velocity. The frequency of the reference clock is 40 MHz in this case; however, the frequency of the reference clock may be properly selected in accordance with a required Doppler frequency.

FIGS. 6A and 6B exemplarily illustrate an analog signal to be input to the processor 101 as described above. FIG. 6B shows a portion of FIG. 6A in an enlarged manner. As described above, the signal output from the head unit 100 is a signal with a large change in amplitude theoretically generated in a Doppler signal. Also, noise generated in an electric circuit (for example, switching noise of a power supply, or noise accompanied by driving of the EO elements) is superimposed on current for driving the light source 1. Hence, low frequency noise and high frequency noise are mixed into the signal output from the head unit 100 in addition to the Doppler signal. The states of the signal indicated by arrows in FIG. 6B are states with small amplitudes of low frequency components. In a state (a portion) lower than the threshold of the binarization by the comparator, the signal obtained by the binarization is zero (lacks). Such a state is also called dropout. Also, a state (a portion) higher than the threshold due to the high frequency noise component, a signal different from the Doppler signal may be included in the signal obtained by the binarization.

Figure 7:
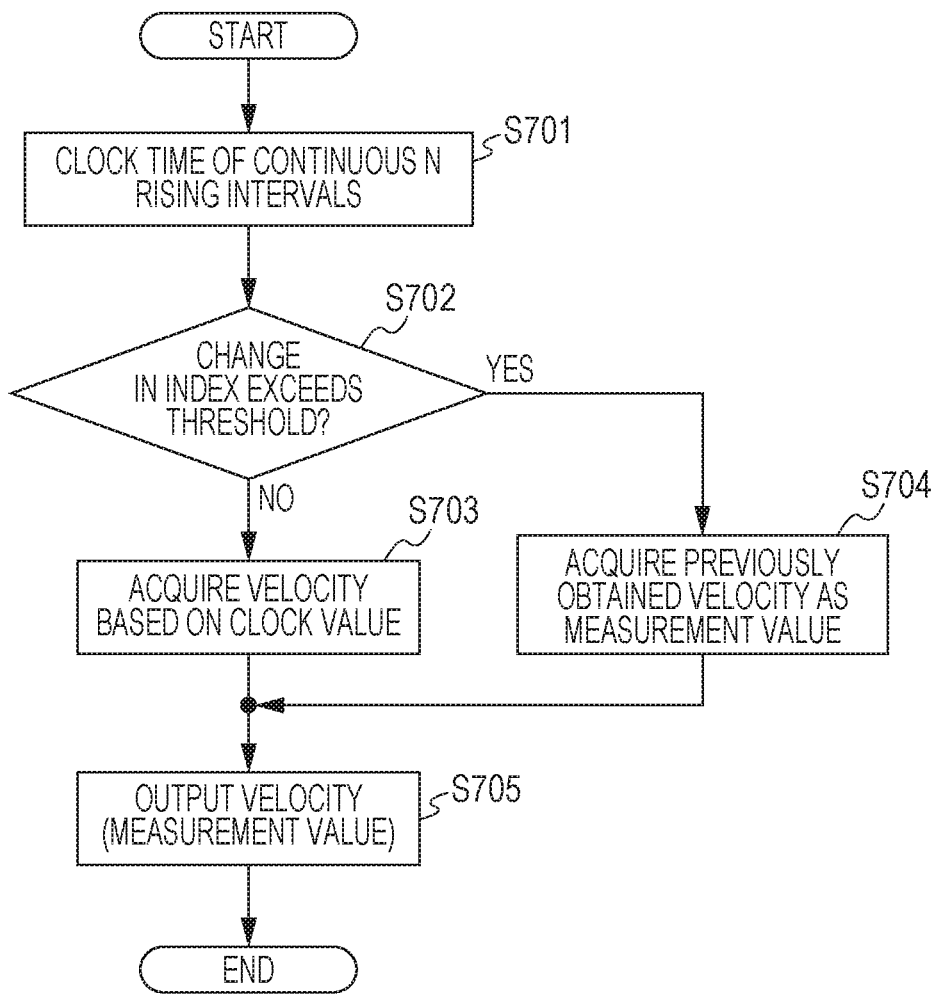
FIG. 7 exemplarily illustrates a flow of processing in the processor.
Figure 8A:
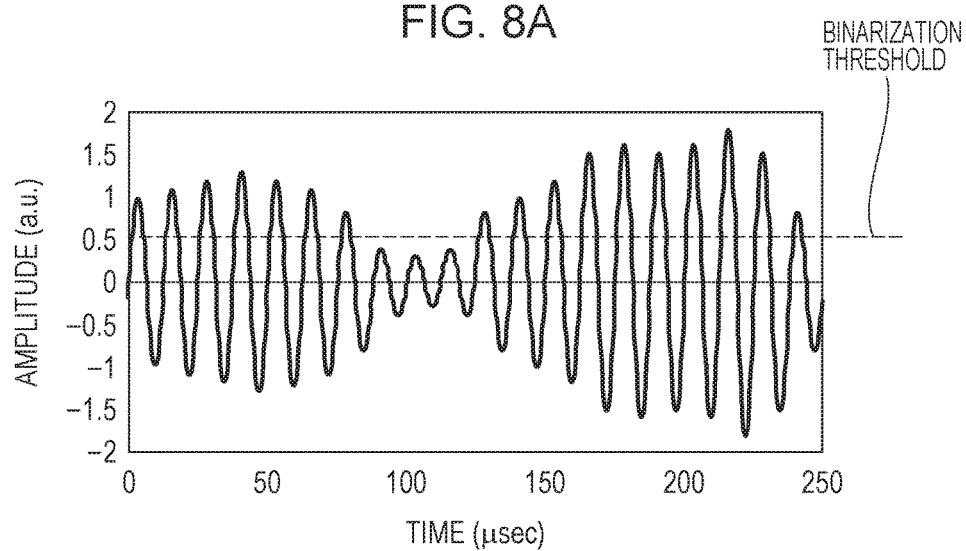
FIGS. 8A and 8B exemplarily illustrate a signal when a dropout is generated.
Figure 8B:
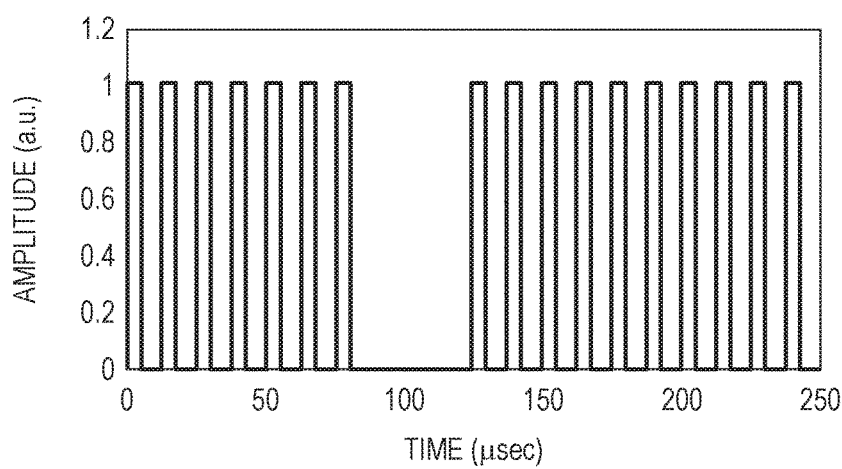
Figure 9A:
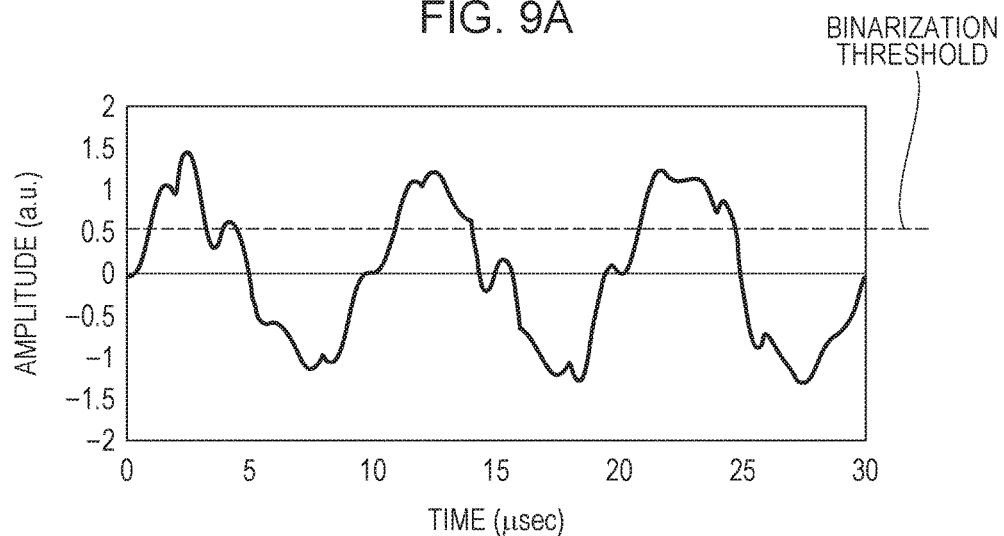
FIGS. 9A and 9B exemplarily illustrate a signal when noise is mixed.
Figure 9B:
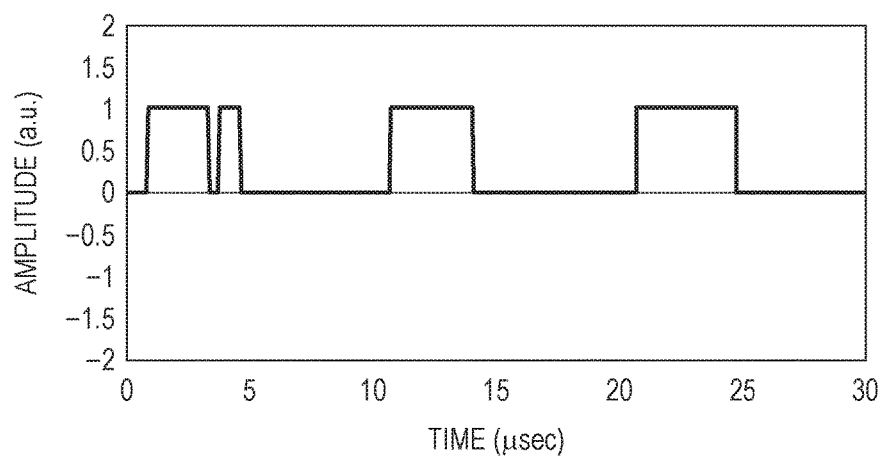

FIG. 7 exemplarily illustrates a flow of processing by the calculator in the processor. In the processor 101 of FIG. 4, the signal obtained by the binarization by the comparator is input to the calculator 405. First, in step S701, the calculator 405 clocks (counts) a time (a time duration over a predetermined number of pulses) of continuous (a series of) N rising intervals (pulse intervals) in the signal obtained by the binarization by using the reference clock as shown in FIGS. 5A to 5C. In subsequent step S702, it is determined whether or not a change in an index relating to the time duration (the clock value) exceeds a threshold. The index may be the time duration D, the Doppler frequency F corresponding to the time duration D, the velocity V of the object 10 corresponding to the Doppler frequency F, or another value correlating to these values. FIGS. 8A and 8B exemplarily illustrate a signal when a dropout is generated. If a dropout is generated in an analog signal including a Doppler signal at a time around 100 μsec as shown in FIG. 8A, a pulse lacks in the signal obtained by binarization as shown in FIG. 8B. Also, FIGS. 9A and 9B exemplarily illustrate a signal when noise is mixed. If noise is mixed into an analog signal including a Doppler signal at a time around 3 μsec as shown in FIG. 9A, a pulse splits in the signal obtained by the binarization as shown in FIG. 9B.

Figure 10A:
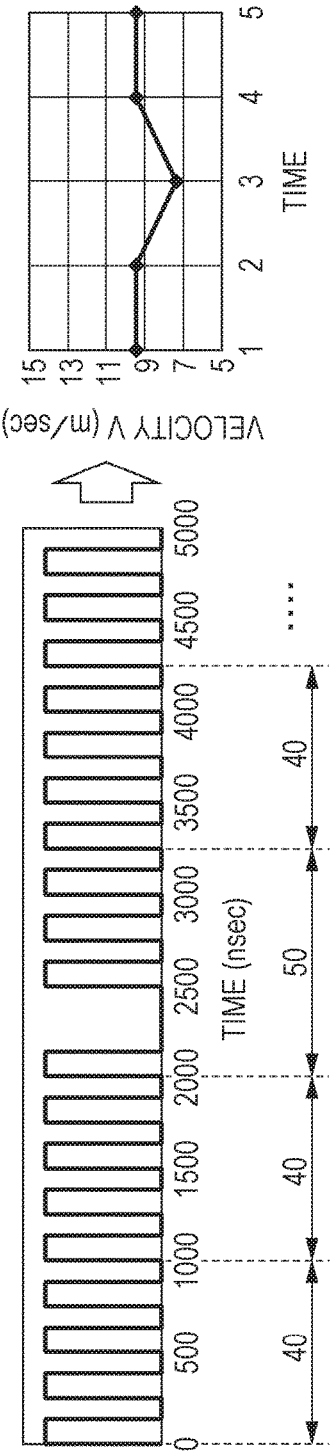
FIGS. 10A and 10B exemplarily illustrate measurement values determined as errors.
Figure 10B:
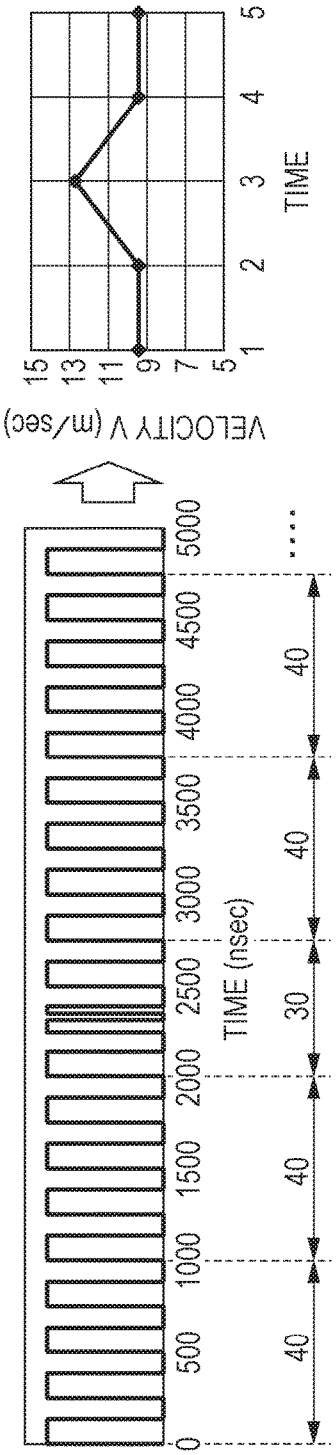

FIGS. 10A and 10B exemplarily illustrate measurement values determined as errors. FIG. 10A exemplarily illustrates a velocity (a measurement value) obtained if a dropout as shown in FIG. 8B is present. When the rising intervals of every N=4 are clocked, the count value of the reference clock may be 50 counts as the result that a pulse lacks due to a dropout. If the velocity is obtained on the basis of such clock values, the velocity is like a graph on the right side in FIG. 10A. If the number of pulse lacks due to dropouts increases, the number of errors of measurement values also increases. FIG. 10B exemplarily illustrates a velocity (a measurement value) obtained if noise as shown in FIGS. 9A and 9B is mixed. Even in this case, when the rising intervals of every N=4 are clocked, the count value of the reference clock may be 30 counts as the result that a pulse splits due to mixing of noise. If the velocity is obtained on the basis of these clock values, the velocity is like a graph on the right side in FIG. 10B. If the number of pulse splits due to mixing of noise increases, the number of errors of measurement values also increases.

A change in the count values continuously acquired in time series may be considered to be within a predetermined range with regard to a change in the velocity of the object 10 within a predetermined time. For example, when the velocity V of the object 10 is currently 9.5 [m/s] and changes with an acceleration of 10 [m/s$^2$], a change in the velocity in the time duration D of every N=4 is only 10 [μm/s]. Regarding the ratio of the change in the velocity to the velocity, although the ratio is inversely proportional to the velocity, the change in the velocity is about 0.17 [mm/s] and is sufficiently small even if V=0.1 [m/s] (the ratio being about 0.17%). Therefore, if the change in the index exceeds L [%] of a previously obtained index, it may be determined that a dropout or mixing of noise is generated. L is expressed by Expression (3) as follows:

$$L=((N+1)/N-1)\times 100 \qquad (3).$$

Accordingly, the threshold in step S702 in FIG. 7 can be obtained as L [%] of the (previously obtained) index. Then, if the change in the index is the threshold (L [%] of the index) or smaller, the velocity (the measurement value) is obtained on the basis of the clock value in step S703. In contrast, if the change in the index exceeds the threshold (L [%] of the index), the velocity corresponding thereto is determined as an error, and the previously obtained velocity is used as the measurement value in step S704. In subsequent step S705, the processor 101 outputs the velocity (the measurement value) to another apparatus that requires the information on the velocity. Alternatively, the threshold may be a×L [%] of the index (the coefficient a is a real number that satisfies 0<a<1).

Figure 11A:
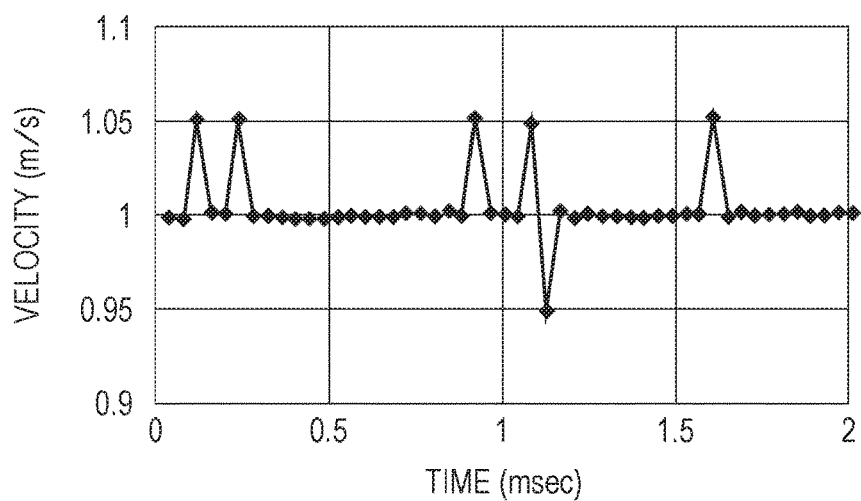
FIGS. 11A and 11B exemplarily illustrate measurement values before correction and measurement values after correction.
Figure 11B:
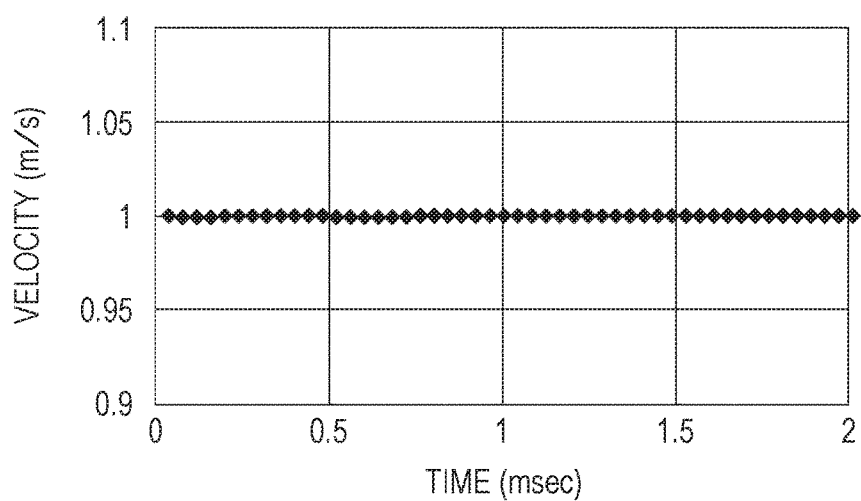

FIGS. 11A and 11B exemplarily illustrate measurement values before correction and measurement values after correction. FIGS. 11A and 11B show the measurement results of the velocity when the object 10 moves at a velocity V≈9.5 [m/s]. FIG. 11A shows the measurement result when the correction (step S702 to step S704) according to this embodiment is not performed. FIG. 11B shows the measurement result when the correction is performed. Referring to FIGS. 11A and 11B, it is found that the measurement result with high accuracy (high reproducibility) as shown in FIG. 11B can be obtained according to this embodiment.

As described above, with this embodiment, robust measurement can be performed against a dropout and mixing of noise. Accordingly, for example, the velocimeter advantageous in view of measurement accuracy can be provided.

In the above description, it is determined whether the change in the index exceeds the threshold or not on the basis of the threshold based on the previously (preparatorily) obtained index by the calculator 405 (in step S702). However, the threshold may be a threshold based on previously (preparatorily) obtained M indices (for example, an average of these). Also, the average may not be a simple average, and may be a weighted average, a synergistic average, or another average. Also, in the above description, the previously obtained velocity is used as the measurement value based on the assumption that the obtained velocity is an error in step S704. However, instead of this, the velocity based on a plurality of previously obtained measurement values (for example, an average of these) may be used as a measurement value. Also, the average may not be a simple average, and may be a weighted average, a synergistic average, or another average. For example, if it is previously recognized that a variation in the velocity of the object 10 is small, stable measurement can be performed by increasing the value of M. Also, if the magnitude of the variation in the velocity is previously roughly expected, the value of M is decreased as possible on the basis of the magnitude. Accordingly, followability (validity) of the threshold for the error determination can be improved. With the study of the inventors, it is found that the followability is improved by setting M=16 or smaller if the acceleration of the object 10 is about 1 [G].

FIGS. 12A, 12B, and 12C1 to 12C5 exemplarily illustrate the amplitude of a signal from the detector and the reliability of a measurement value. FIG. 12A schematically illustrates the amplitude of a signal obtained from the detector from when the object 10 moving at the velocity V enters the light rays 9 to when the object 10 escapes from the light rays 9. The amplitude may vary locally (in a short time) and a dropout may occur as described above. However, if an average (a movement average) is obtained for a certain range (a time), stable values which smoothly change as shown in FIG. 12B may be obtained. Also, FIGS. 12C1 to 12C5 show respective states from a state C1 before the object 10 enters the light rays 9 to a state C5 when the object 10 escapes from the light rays 9.

The state C1 in FIG. 12A corresponding to FIG. 12C1 is before the object 10 enters the light rays 9. Hence, the Doppler signal cannot be detected (the amplitude is the threshold or smaller). That is, a series of pulses cannot be obtained from the comparator, and the velocity cannot be obtained. At a time (also referred to as a timing) A at which the object 10 enters the light rays 9, the amplitude starts increasing (the state C2 in FIG. 12A corresponding to FIG. 12C2). At a time B at which the object 10 passes through the light rays 9, the signal is stable (the state C3 in FIG. 12A corresponding to FIG. 12C3). At a time at which the object 10 starts escaping from the light rays 9, the amplitude of the signal starts decreasing (the state C4 in FIG. 12A corresponding to FIG. 12C4). At a time at which the object 10 has escaped from the light rays 9, the state returns to a state in which the Doppler signal cannot be detected (the state C5 in FIG. 12A corresponding to FIG. 12C5). At the time A, since the previously obtained measurement value (the velocity) required for performing the above-described correction is not present, proper correction cannot be performed even if an error occurs in measurement, and a measurement value including the error may be output. Also, since the measurement value including the error is employed, the reliability of the measurement value at the time A is low, and the reliability of the measurement value increases toward the time B. At the time C, the signal is stable, and the reliability of the measurement value is saturated. FIG. 12B illustrates this reliability. Regarding the reliability, for example, at the time A or the point in time immediately after the time A, the amplitude of the signal is small and hence a dropout is likely generated, resulting in that the reliability relies on the correction. Therefore the reliability is very low. Then, as the time elapses and the amplitude increases, a dropout becomes hardly generated. Therefore the reliability increases. At the time C, since the signal is stable and the amplitude is saturated, the reliability of the measurement value is also saturated. At the point in time of escape (the point in time of the state C4), since the amplitude is not very low and the measurement value (the velocity) with high reliability is previously obtained, proper correction can be performed, and hence the reliability is not decreased. Then, the amplitude rapidly decreases after the escape is completed. The reliability rapidly decreases, and becomes similar to the reliability immediately before the time A.

Figure 13:
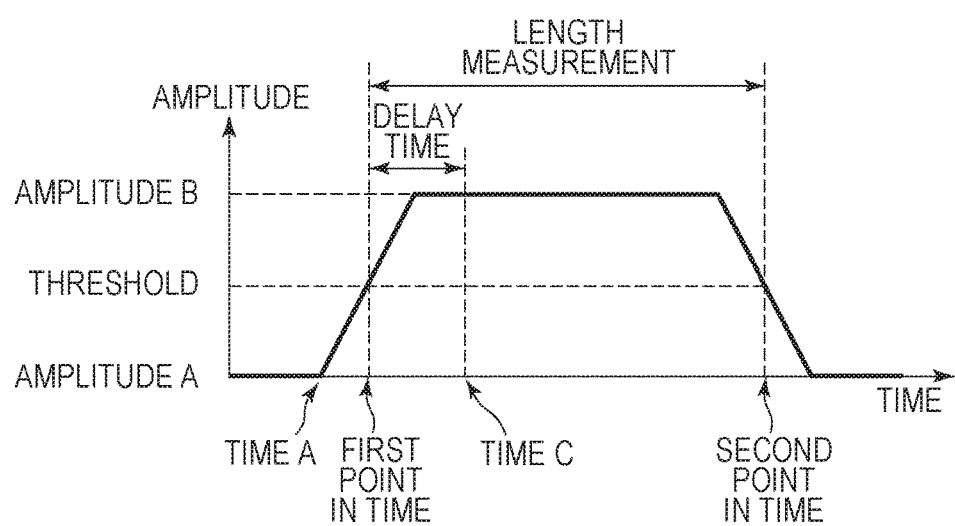
FIG. 13 exemplarily illustrates length measurement processing contents.

The length measuring apparatus according to this embodiment is a length measuring apparatus that performs length measurement for an object moving in a measurement region, in a measurement direction (a moving direction of the object). The length measuring apparatus specifies a start point in time (a first point in time or a first trigger) and an end point in time (a second point in time or a second trigger) for the length measurement on the basis of a threshold between an amplitude A and an amplitude B in FIG. 12A. Then, the length measurement is performed for the object 10 on the basis of the measurement value (the velocity) from the first point in time to the second point in time. FIG. 13 exemplarily illustrates length measurement processing contents. When a point in time at which the amplitude of the signal exceeds the threshold is a first point in time (corresponding to one end of the object 10) and a point in time at which the signal then becomes the threshold or smaller is a second point in time (corresponding to the other end of the object 10), the time duration between the first point in time and the second point in time is a length measurement object. The threshold may be properly set, for example, by Expression (4) as follows:

$$\text{threshold}=(\text{amplitude } A+\text{amplitude } B)/2 \qquad (4).$$

Figure 14:
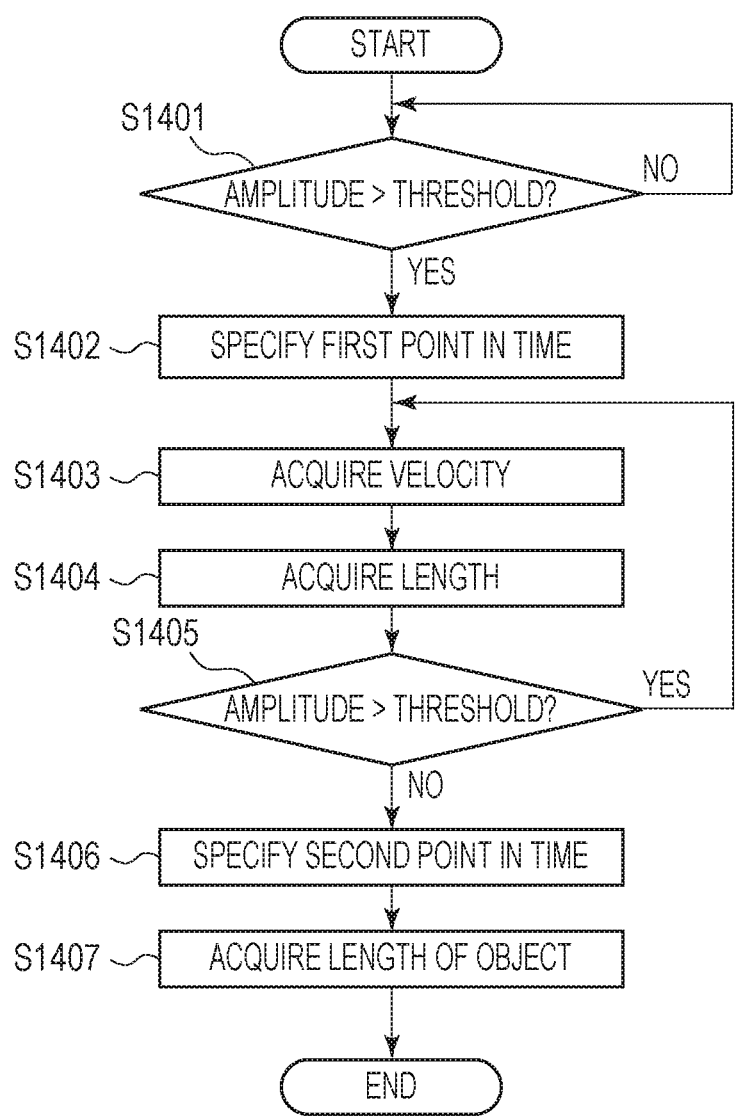
FIG. 14 exemplarily illustrates a flow of length measurement processing.

FIG. 14 exemplarily illustrates a flow of length measurement processing. The processing is performed by the processor 101. First, in step S1401, it is determined whether the amplitude of the signal obtained from the detector 100 exceeds a threshold or not. If the determination result is NO, this determination is repeated. If the determination result is YES, a first point in time is specified (step S1402). Then, acquisition of a velocity (a measurement value) (step S1403), and acquisition of a length (step S1404) are performed. The length is obtained by accumulating the product of an acquired velocity and a time corresponding to the velocity (addition to a previous cumulative value). In subsequent step S1405, it is determined whether the amplitude of the signal newly obtained from the detector 100 exceeds the threshold or not. If the determination result is YES, the processing from step S1403 to step S1405 is repeated. If the determination result is NO, a second point in time is specified (step S1406). Then, in subsequent step S1407, the length measurement value (the length) obtained by the above-described accumulation is acquired as the length of the object 10. The length is stored in a memory (not shown) of the processor 101 or is output to another apparatus. Then, the processing is ended.

Figure 15:
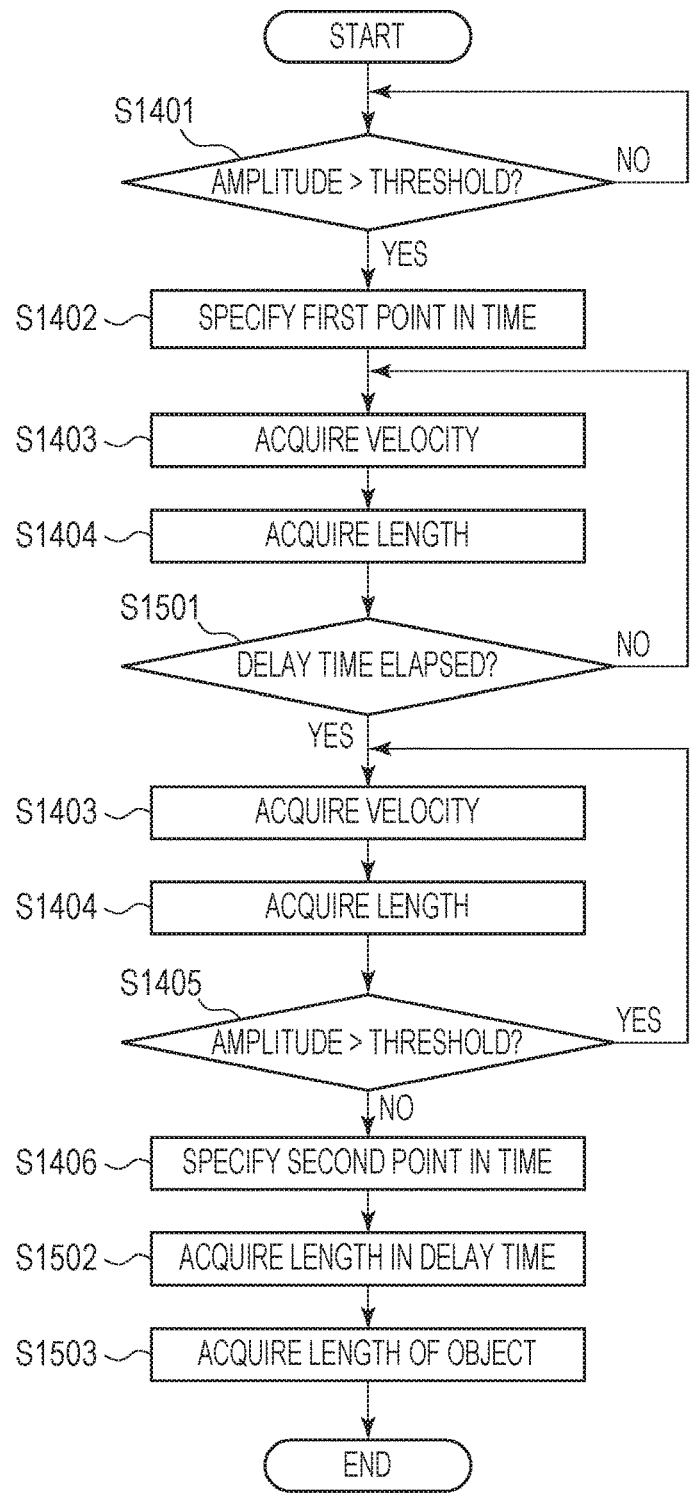
FIG. 15 exemplarily illustrates a flow of length measurement processing.

As described above, since the reliability of the measurement value (the velocity) is not sufficient from the time A to the time C, in the period from the first point in time to the time C (also referred to as delay time or delay time duration), the length may be calculated (accumulated) on the basis of the measurement value including an error. This length measurement error may be no problem for the purpose of use in which the measurement error is negligible. However, if the length measurement error is not negligible, to decrease such a length measurement error, instead of using the actual measurement value of the velocity including the error in the delay time duration, the velocity in the delay time duration is desirably obtained by extrapolation. The extrapolation in this case is based on the measurement value (the velocity) with high reliability in the time duration during and after the delay time duration. FIG. 15 exemplarily illustrates a flow of length measurement processing in case of extrapolation. The same reference sign is applied to the same processing as that in FIG. 14, and the redundant description is omitted. If extrapolation is performed, it is determined whether the delay time (the delay time duration) has elapsed or not in step S1501 before the second point in time is specified. As the point in time at which the delay time duration has elapsed, a point in time at which the reliability of the measurement value is sufficiently high is set, and hence sufficiently correct length measurement can be performed. If the determination result is NO, the processing from step S1403 to step S1501 is repeated. If the determination result is YES, the processing in step S1403 and step S1404 is performed also in this case. After the specification of the second point in time in step S1406, the length in the delay time duration is acquired in step S1502. The measurement value (the velocity) in the delay time duration includes an error as described above. Hence, the average velocity in the time duration from the time C to the second point in time is obtained, and the length (of a portion of the object) in the delay time duration is obtained by Expression (5) as follows:

$$\text{length in delay time duration} = \text{average velocity} \times \text{delay time} \quad (5).$$

In subsequent step S1503, the length of the object 10 is acquired by using the sum of the length in the delay time duration and the length obtained by the accumulation after the delay time duration elapses. That is, the length of the object 10 can be obtained by Expression (6) as follows:

$$\text{length of object 10} = \text{length in delay time duration} + \text{length obtained by accumulation after delay time duration elapses} \quad (6).$$

The length is stored in the memory (not shown) of the processor 101 or is output to another apparatus. Then, the processing is ended.

As described above, with this embodiment, the length measuring apparatus advantageous to perform length measurement for a moving object without an additional (dedicated) sensor like related art can be provided.

Second Embodiment

A second embodiment of the present invention is described. In the first embodiment, the threshold is previously set; however, the threshold may be set after start of measurement. That is, the threshold may be obtained from Expression (4) on the basis of the amplitude A and the amplitude B being known by measurement. Then, the first point in time, the second point in time, and the delay time duration are specified on the basis of the threshold. Accordingly, the length of the object 10 can be obtained from Expression (6).

Third Embodiment

A third embodiment of the present invention is described. In the first embodiment, the delay time is previously set; however, the determination on whether the delay time (the delay time duration) has elapsed or not may be made during measurement. That is, since the time C at which the reliability of the measurement value is sufficient (satisfies the allowance condition) is figured out by the measurement, the length of the object 10 can be obtained from Expression (6).

Fourth Embodiment

Figure 16:
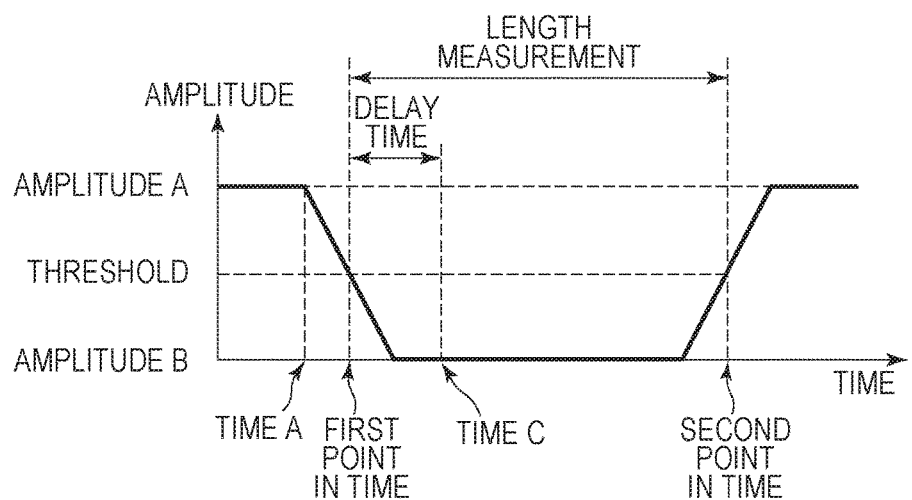
FIG. 16 exemplarily illustrates length measurement processing contents.

A fourth embodiment of the present invention is described. In each of the above-described embodiments, the amplitude B is larger than the amplitude A. However, if the light rays 9 irradiate an object (for example, a mirror surface) with high reflectivity than the reflectivity of the object 10 before the object 10 enters the light rays 9, the magnitude relationship between the amplitude A and the amplitude B is inverted. FIG. 16 exemplarily illustrates the length measurement processing contents if the magnitude relationship between the amplitude A and the amplitude B is inverted. The point different from the above-described embodiments is that the point in time at which the amplitude becomes smaller than the threshold is set at a first point in time, and the point at which the amplitude then becomes the threshold or larger is set at a second point in time. This embodiment is similar to the above-described embodiments except for this different point.

Fifth Embodiment

Figure 17A:
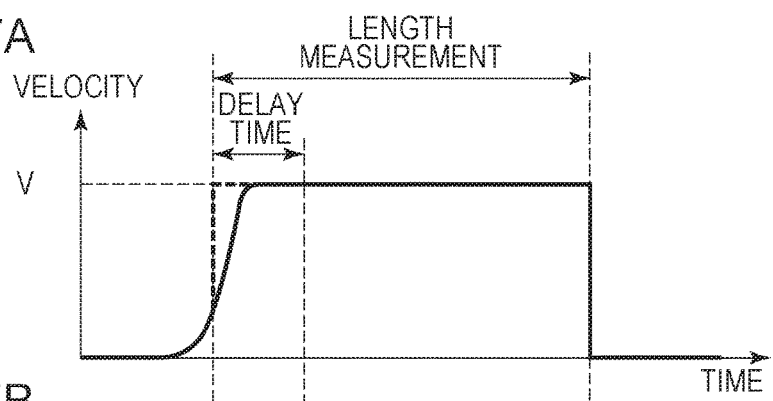
FIGS. 17A and 17B exemplarily illustrate extrapolation of the velocity.
Figure 17B:
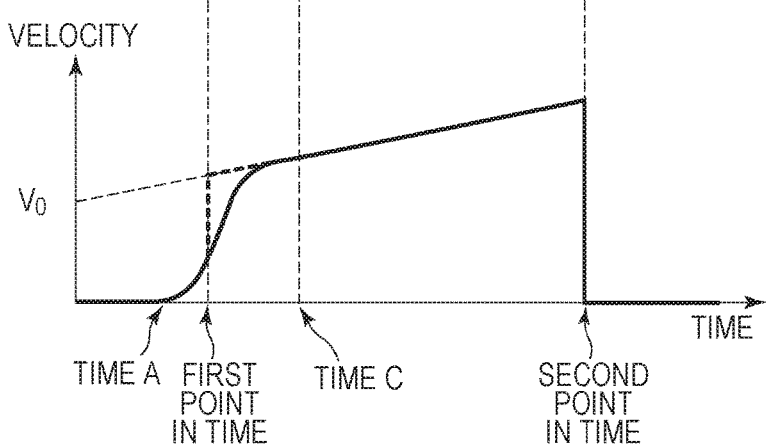

A fifth embodiment of the present invention is described. In the first embodiment, the velocity in the delay time duration is extrapolated as the average (the average velocity) of the velocity after the delay time duration as shown in Expression (5). FIGS. 17A and 17B exemplarily illustrate extrapolation of the velocity. FIG. 17A shows a change in a measurement value (a velocity) when the velocity V of the object 10 is assumed to be constant. Since the velocity V is assumed to be constant, the extrapolation with the average velocity from the time C to the second point in time is sufficient. However, if the velocity V of the object 10 changes with a predetermined acceleration as shown in FIG. 17B, it is not appropriate to obtain the velocity in the delay time duration by the extrapolation with the average velocity in the period from the time C to the second point in time (an error is large). In this case, for example, it is desirable to extrapolate the velocity V by Expression (7) as follows by using the velocity in the time duration form the time C to the second point in time (see FIG. 17B):

$$\text{velocity } V = \text{acceleration } A \times \text{time} + V_0 \quad (7).$$

Then, the length in the delay time duration can be obtained by Expression (8) as follows:

$$\text{length in delay time duration} = (\text{acceleration } A \times \text{first point in time} + \text{acceleration } A \times \text{time } C + V_0 \times 2) \times \text{delay time}/2 \quad (8).$$

Sixth Embodiment

Figure 18:
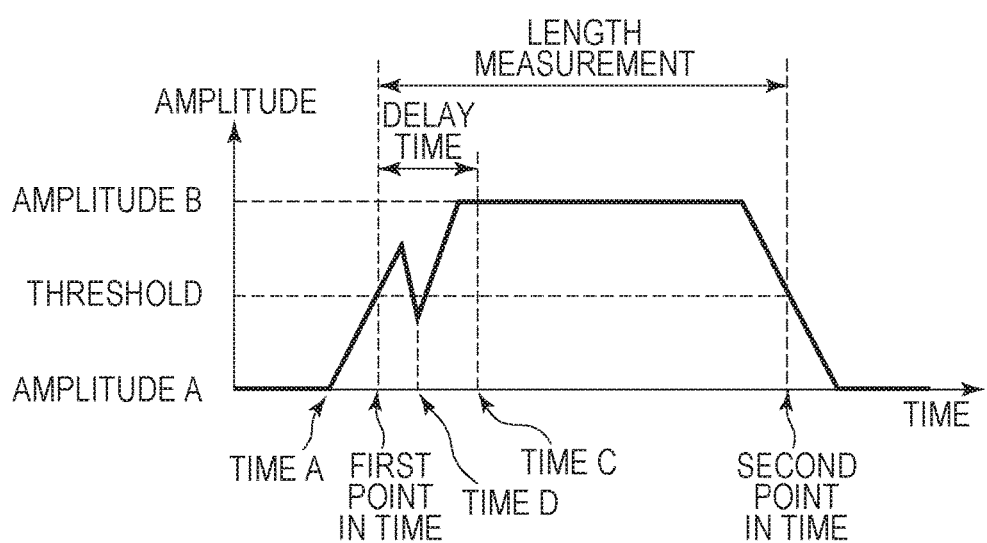
FIG. 18 exemplarily illustrates length measurement processing contents.

A sixth embodiment of the present invention is described. In this embodiment, since the amplitude of the signal is not stable, even if the amplitude exceeds the threshold or becomes equal to or smaller than the threshold regardless of the position in the measurement direction of the object 10 with respect to the measurement region, the first point in time or the second point in time is prevented from being erroneously recognized by using the amplitude. FIG. 18 exemplarily illustrates length measurement processing contents. In FIG. 18, the acquisition of the measurement value (the velocity) is started while the point in time at which the amplitude exceeds the threshold is considered as the first point in time, the amplitude becomes equal to or smaller than the threshold at a time D although the object is passing. In this case, at least the second point in time may be erroneously recognized. Hence, the first point in time is specified on the basis of the amplitude from the time A to the time C. In this case, since the amplitude increases again after the time D, the time D is not erroneously recognized as the second point in time. The second point in time can be also specified on the basis of the amplitude during the transition from the amplitude B to the amplitude A.

Embodiment According to Method of Manufacturing Article

The above-described length measuring apparatus according to the embodiments may be used in a method of manufacturing an article. The method of manufacturing the article may include a step of using the length measuring apparatus and performing length measurement for an object, and a step of processing the object with the length measurement performed in the former step. For example, the processing may include at least one of machining, cutting, inspection, assembling, and selection. To be more specific, length measurement may be performed for a molded part obtained by an extrusion molding apparatus, and at least one of machining, cutting, inspection, assembling, and selection of the molded part may be performed. Also, length measurement for a (long) object conveyed by the conveyance system may be performed and the object may be cut (cut out) to have a target length on the basis of the length measurement. In this case, the length measuring apparatus may be used, a point in time corresponding to an end (the leading end or the trailing end) of the object may be specified, the length measurement may be performed on the basis of the velocity in a time duration defined by the point in time, a point in time at which the measurement value meets the target value may be specified, and the object may be cut at a portion (a position) corresponding to the point in time. Accordingly, in the length measuring apparatus, the points in time corresponding to both ends of the object are not necessarily specified (only one end may be specified). The method of manufacturing the article according to this embodiment uses the length measuring apparatus advantageous to perform the length measurement for the moving object as described above. As compared with the method of related art, the method is advantageous for at least one of the performance, quality, productivity, and manufacturing cost.

The embodiments of the invention have been described above; however, the present invention is not limited to these embodiments, and may be modified or changed in various ways within the scope of the invention.

The present invention can provide a length measuring apparatus, for example, advantageous to perform the length measurement for a moving object.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-132152 filed Jun. 30, 2015, which is hereby incorporated by reference herein in its entirety.

What is claimed is:

1. A length measuring apparatus configured to perform length measurement for an object moving in a measurement region, the apparatus comprising:
a light source;
a light receiving element configured to receive light reflected by the object and modulated by the object with a Doppler effect, and configured to output a signal based on the received light; and
a processor configured to:
obtain an amplitude of the output signal;
set an amplitude threshold;
compare the obtained amplitude of the output signal with the amplitude threshold;
specify a first time and a second time corresponding to a first position and a second position, respectively, of the object based on a result of the comparison;
obtain a measurement value of a velocity of the object based on the output signal between the first time and the second time; and
obtain a length of the object based on the obtained measurement value.

2. The length measuring apparatus according to claim 1, wherein the processor is configured to obtain the length based on the obtained measurement value of the velocity and a period between the first time and the second time.

3. The length measuring apparatus according to claim 1, wherein the processor is configured to set a delay time from the first time, and obtain the velocity until the delay time elapses from the first time based on the velocity after the delay time has elapsed from the first time.

4. The length measuring apparatus according to claim 1, wherein the processor is configured to set a delay time from the first time, and extrapolate the velocity until the delay time elapses from the first time based on the velocity after the delay time has elapsed from the first time.

5. The length measuring apparatus according to claim 3, wherein the processor is configured to set, as the delay time, a predetermined time from the first time.

6. The length measuring apparatus according to claim 1, wherein the processor is configured to set the amplitude threshold based on a first amplitude and a second amplitude, wherein the first amplitude is the amplitude of the output signal in a case where the object is not present in the measurement region, and the second amplitude is the amplitude of the output signal in a case where the object is overlapped with the measurement region in a measurement direction.

7. The length measuring apparatus according to claim 6, wherein the processor is configured to set the amplitude threshold as an average between the first amplitude and the second amplitude.

8. The length measuring apparatus according to claim 1, wherein
the processor determines whether the obtained amplitude of the output signal is more than or less than the amplitude threshold, and
the processor specifies the first time when the processor determines that the obtained amplitude of the output signal is more than or less than the amplitude threshold.

9. The length measuring apparatus according to claim 1, wherein the amplitude threshold is other than zero.

10. The length measuring apparatus according to claim 1, wherein the amplitude threshold is variable.

11. A method for performing length measurement for an object moving in a measurement region, the method comprising:
at a length measuring apparatus that includes a light source and a light receiving element, wherein the light receiving element is configured to receive light reflected by the object and modulated by the object with a Doppler effect, and is configured to output a signal based on the received light:
obtaining an amplitude of the output signal;

setting an amplitude threshold;
comparing the obtained amplitude of the output signal with the amplitude threshold;
specifying a first time and a second time corresponding to a first position and a second position, respectively, of the object based on a result of the comparison;
obtaining a measurement value of a velocity of the object based on the output signal between the first time and the second time; and
obtaining a length of the object based on the obtained measurement value.

\* \* \* \* \*